(12) United States Patent
Ohkubo

(10) Patent No.: US 8,003,913 B2
(45) Date of Patent: Aug. 23, 2011

(54) BASE PLATE WITH ELECTRODES, PROCESS FOR PRODUCING THE SAME, AND ELECTRO-OPTICAL DEVICE

(75) Inventor: Kazunobu Ohkubo, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 1078 days.

(21) Appl. No.: 11/438,299

(22) Filed: May 23, 2006

(65) Prior Publication Data

US 2006/0262375 A1 Nov. 23, 2006

(30) Foreign Application Priority Data

May 23, 2005 (JP) ................ 2005-149593

(51) Int. Cl.
*B23K 9/00* (2006.01)
*H01J 1/62* (2006.01)
*H01J 63/04* (2006.01)

(52) U.S. Cl. ................... 219/121.4; 313/504
(58) Field of Classification Search .......... 359/245; 438/29, 52–60; 219/121.4; 313/502, 50, 313/504; 315/169.3
See application file for complete search history.

(56) References Cited

U.S. PATENT DOCUMENTS

| 6,690,108 B2 | 2/2004 | Yamaguchi et al. |
| 6,864,628 B2 * | 3/2005 | Yamazaki et al. ............ 313/504 |
| 2004/0009303 A1 * | 1/2004 | Ito et al. .......... 427/421 |
| 2005/0003567 A1 * | 1/2005 | Yasukawa et al. ............ 438/30 |
| 2005/0057154 A1 * | 3/2005 | Masumo ............ 313/512 |
| 2006/0223256 A1 * | 10/2006 | Saitoh et al. ........... 438/201 |
| 2006/0244368 A1 | 11/2006 | Nagayama et al. |

FOREIGN PATENT DOCUMENTS

| JP | 2002-025781 A | 1/2002 |
| JP | 2002-359083 A | 12/2002 |
| JP | 2002359083 A | * 12/2002 |
| JP | 2004-259561 A | 9/2004 |
| WO | 2005004550 A1 | 1/2005 |

OTHER PUBLICATIONS

Office Action issued in JP 2005149593 dated Nov. 2, 2010.

* cited by examiner

*Primary Examiner* — Quang T Van
*Assistant Examiner* — Hung Nguyen
(74) *Attorney, Agent, or Firm* — Sughrue Mion, PLLC

(57) ABSTRACT

Electrodes are formed in a predetermined pattern on a base plate. Side face regions of each electrode or certain regions of each electrode, which certain regions contain the side face regions and neighboring regions, have a composition different from the composition of the other region and have insulation characteristics. The base plate with electrodes is produced with a process wherein a conductor layer is formed on the base plate, a resist pattern is formed on the conductor layer, the conductor layer is etched with the resist pattern acting as a mask, the electrodes being thereby formed in the predetermined pattern, and an insulation characteristics imparting processing gas is brought into contact with the electrodes.

3 Claims, 5 Drawing Sheets

BASE PLATE WITH ELECTRODES, PROCESS FOR PRODUCING THE SAME, AND ELECTRO-OPTICAL DEVICE

BACKGROUND OF THE INVENTION

1. Field of the Invention

This invention relates to a base plate with electrodes, which base plate is provided with a plurality of electrodes having been formed in a predetermined pattern, and a process for producing the base plate with electrodes. This invention also relates to an electro-optical device and an electroluminescent device, each of which comprises the base plate with electrodes.

2. Description of the Related Art

Electroluminescent devices (EL devices) are self-emitting devices having a structure in which at least a lower electrode, a light emitting layer capable of emitting light with voltage application or electric current application, and an upper electrode are overlaid on a base plate.

FIG. 8 is a fragmentary sectional view taken in a thickness direction of a conventional EL device, the view acting as an aid in explaining problems encountered with the conventional EL device. As illustrated in FIG. 8, a lower electrode 120 is formed in a predetermined pattern on a base plate 110. Also, a light emitting layer 140 and an upper electrode 150 are overlaid so as to extend through a region on the lower electrode 120 and through an adjacent electrode gap. In such cases, there is a tendency for the layer thickness of the region of the light emitting layer 140, which region is located along the side face of the lower electrode 120, to become thinner than the layer thicknesses of the other regions of the light emitting layer 140.

More of the electric current is apt to flow through the thin region of the light emitting layer 140 than through the other regions of the light emitting layer 140. Therefore, the electric current flows preferentially among the upper electrode 150, and the thin region of the light emitting layer 140, which region is located along the side face of the lower electrode 120 and is not required to emit the light, and the lower electrode 120. The thus flowing electric current is an unnecessary leak current.

In cases where the leak current flows through the region of the light emitting layer 140, which region is located along the side face of the lower electrode 120, there is the risk that the quantity of the electric current flowing through the region of the light emitting layer 140, which region is located on the top surface of the lower electrode 120 and is required to emit the light, will become small, and that a desired light emission intensity will not be capable of being obtained. Also, there is the risk that the light emission quantities with respect to pixels will become nonuniform, and that nonuniformity in light emission pattern will occur.

Further, in cases where the electric current flows preferentially through the region of the light emitting layer 140, which region is located along the side face of the lower electrode 120 and is formed so as to have the small layer thickness, the region of the light emitting layer 140 deteriorates comparatively quickly, and the layer thickness of the region of the light emitting layer 140 becomes thin quickly. Therefore, in cases where the period of time of use becomes long, the problems described above are aggravated. If the layer thickness of the region of the light emitting layer 140, which region is located along the side face of the lower electrode 120, becomes markedly small, there will be the risk that short-circuiting will occur between the lower electrode 120 and the upper electrode 150.

An EL device provided with a black matrix (EM) for blocking off electrode gaps of a plurality of lower electrodes is disclosed in, for example, Japanese Unexamined Patent Publication No. 2002-359083. The disclosed EL device is produced with a process comprising the steps of: (a) forming a film of an electrode material on a base plate, an electrical conductor layer being thereby formed on the base plate, (b) performing coating, exposure, and development of a resist, a resist pattern in accordance with a pattern of lower electrodes being thereby formed, (c) etching the electrical conductor layer with the resist pattern acting as a mask, the pattern of the plurality of the lower electrodes being thereby formed, (d) removing the resist pattern, and (e) performing coating, exposure, and development of a different resist, a BM for blocking off electrode gaps of the plurality of the lower electrodes being thereby formed.

With the EL device disclosed fin, for example, Japanese Unexamined Patent Publication No. 2002-359083, the side face of each of the lower electrodes is covered with the BM having the electrical insulation characteristics. Therefore, the occurrence of the leak current flowing through the side face of each of the lower electrodes is capable of being suppressed. However, with the EL device disclosed in, for example, Japanese Unexamined Patent Publication No. 2002-359083, besides the exposure of the resist for the formation of the patterning mask for the lower electrodes, it is necessary for the exposure of the resist for the formation of the BM to be performed. Accordingly, the number of the processing steps is not capable of being kept small, and the production efficiency is not capable of being kept high. Also, there is the risk that a fine gap will occur between the side face of each of the lower electrodes and the BM due to a shift of alignment of the photomask occurring at the time of the exposure of the resist for the formation of the BM to light. In such cases, the side face of each of the lower electrodes will not be capable of being accurately covered with the BM, and the occurrence of the leak current flowing through the side face of each of the lower electrodes will not be capable of being suppressed.

As illustrated in, for example, FIG. 3 of Japanese Unexamined Patent Publication No. 2002-359083, with the shift of the alignment of the photomask being taken into the consideration, part of each of the lower electrodes and part of the BM may be caused to overlap each other. In such cases, the side face of each of the lower electrodes is capable of being reliably imparted with the electrical insulation characteristics. However, in such cases, the problems occur in that an open face rate of the lower electrodes is not capable of being kept high. In cases where pitches of the lower electrodes are set at large values, though the open face rate of the lower electrodes becomes low, a large open face area of the lower electrodes is capable of being obtained. However, in such cases, the problems occur in that the resolution becomes low, and displaying quality is not capable of being kept good.

The adverse effects of the occurrence of the leak current, which flows through the side face of each of the electrodes, upon the displaying quality, the reliability, and the like, are comparatively large in the cases of the EL device. The problems with regard to the occurrence of the leak current, which flows through the side face of each of the electrodes, may occur also with liquid crystal devices, in which electrodes are formed on an inside surface of at least either one of a pair of base plates located so as to stand facing each other with a liquid crystal layer intervening there between.

SUMMARY OF THE INVENTION

The primary object of the present invention is to provide a base plate with electrodes, wherein side faces of electrodes are capable of being reliably imparted with electrical insulation characteristics by use of a simple process, such that an open face rate of the electrodes may not become markedly low.

Another object of the present invention is to provide a process for producing the base plate with electrodes.

A further object of the present invention is to provide an electro-optical device comprising the base plate with electrodes.

A still further object of the present invention is to provide an electroluminescent device comprising the base plate with electrodes.

The term "electro-optical device" as used herein means a group of an EL device, a liquid crystal device, and the like.

The present invention provides a first base plate with electrodes, comprising:
i) a base plate, and
ii) a plurality of electrodes, which have been formed in a predetermined pattern on the base plate,
each of the electrodes having a structure such that side face regions of each of the electrodes or certain regions of each of the electrodes, which certain regions contain the side face regions and regions neighboring with the side face regions, have a composition different from the composition of the other region of each of the electrodes and have electrical insulation characteristics.

By way of example, the first base plate with electrodes in accordance with the present invention may be modified such that the base plate with electrodes is produced with a process comprising the steps of:
a) forming a film of an electrode material on the base plate, an electrical conductor layer being thereby formed,
b) forming a resist pattern on the electrical conductor layer and in accordance with the predetermined pattern of the plurality of the electrodes,
c) performing etching processing on the electrical conductor layer by the utilization of the resist pattern as a mask, the plurality of the electrodes being thereby formed in the predetermined pattern,
d) bringing an insulation characteristics imparting processing gas into contact with the plurality of the electrodes, and
e) removing the resist pattern from the plurality of the electrodes.

The present invention also provides a second base plate with electrodes, comprising:
i) a base plate,
ii) a plurality of electrodes, which have been formed in a predetermined pattern on the base plate, and
iii) electrical insulating sections, which have been formed at electrode gaps among the plurality of the electrodes,
the base plate with electrodes being produced with a process comprising the steps of:
a) forming a film of an electrode material on the base plate, an electrical conductor layer being thereby formed,
b) forming a resist pattern on the electrical conductor layer and in accordance with the predetermined pattern of the plurality of the electrodes,
c) bringing an insulation characteristics imparting processing gas into contact with the electrical conductor layer by the utilization of the resist pattern as a mask, the insulation characteristics imparting processing gas causing a composition of corresponding regions of the electrical conductor layer to alter, the electrical insulating sections being thereby formed through the alteration of the composition of the corresponding regions of the electrical conductor layer, and
d) removing the resist pattern from the electrical conductor layer.

The present invention further provides a third base plate with electrodes, comprising:
i) a base plate,
ii) a plurality of electrodes, which have been formed in a predetermined pattern on the base plate, and
iii) electrical insulating sections, which have been formed at electrode gaps among the plurality of the electrodes, the base plate with electrodes being produced with a process comprising the steps of:
a) forming a film of an electrode material on the base plate, an electrical conductor layer being thereby formed,
b) forming a resist pattern on the electrical conductor layer and in accordance with the predetermined pattern of the plurality of the electrodes,
c) performing etching processing on the electrical conductor layer by the utilization of the resist pattern as a mask, the plurality of the electrodes being thereby formed in the predetermined pattern,
d) forming the electrical insulating sections at the electrode gaps among the plurality of the electrodes by use of a material different from the electrode material, such that the electrical insulating sections cover side face regions of the electrodes, and
e) removing the resist pattern from the plurality of the electrodes.

The third base plate with electrodes in accordance with the present invention may be modified such that the electrical insulating sections are made from a material, which has hydrophilic-hydrophobic characteristics different from the hydrophilic-hydrophobic characteristics of the resist pattern.

The present invention still further provides an electro-optical device, having an electrode structure comprising:
i) the first, second, or third base plate with electrodes in accordance with the present invention, and
ii) at least one opposite electrode, which is located on the base plate with electrodes with at least a light emitting layer or a liquid crystal layer intervening between the at least one opposite electrode and the base plate with electrodes, such that an electric field is capable of being applied between each of the plurality of the electrodes of the base plate with electrodes and the at least one opposite electrode.

The present invention also provides an electroluminescent device, comprising:
i) the first, second, or third base plate with electrodes in accordance with the present invention, and
ii) at least one opposite electrode, which is located on the base plate with electrodes with at least a light emitting layer intervening between the at least one opposite electrode and the base plate with electrodes, such that an electric field is capable of being applied between each of the plurality of the electrodes of the base plate with electrodes and the at least one opposite electrode.

With the first base plate with electrodes in accordance with the present invention, each of the electrodes has the structure such that the side face regions of each of the electrodes or the certain regions of each of the electrodes, which certain regions contain the side face regions and regions neighboring with the side face regions, have the composition different from the composition of the other region of each of the electrodes and have the electrical insulation characteristics. By way of example, the first base plate with electrodes in accordance with the present invention is capable of being produced with the process, wherein the insulation characteristics imparting processing gas is brought into contact with the plurality of the electrodes in the state, in which the resist pattern having been formed as the electrode patterning mask remains on the top surfaces of the plurality of the electrodes.

Therefore, with the first base plate with electrodes in accordance with the present invention, the side face regions of the electrodes are capable of being reliably imparted with the electrical insulation characteristics by use of the simple process, such that the open face rate of the electrodes may not become markedly low.

The second base plate with electrodes in accordance with the present invention is produced with the process comprising the steps of: (a) forming the film of the electrode material on the base plate, the electrical conductor layer being thereby formed, (b) forming the resist pattern as the electrode patterning mask on the electrical conductor layer, and (c) (instead of the electrode patterning with ordinary etching being performed) bringing the insulation characteristics imparting processing gas into contact with the electrical conductor layer by the utilization of the resist pattern as the mask, the insulation characteristics imparting processing gas causing the composition of the corresponding regions of the electrical conductor layer to alter, the electrical insulating sections being thereby formed through the alteration of the composition of the corresponding regions of the electrical conductor layer.

With the second base plate with electrodes in accordance with the present invention, the regions of the electrical conductor layer, which regions have been prevented by the resist pattern from being brought into contact with the insulation characteristics imparting processing gas, act as the electrodes, and the plurality of the electrodes, which have been electrically isolated by the electrical insulating sections from one another, are formed in the predetermined pattern. Therefore, with the second base plate with electrodes in accordance with the present invention, the side face regions of the electrodes are capable of being reliably imparted with the electrical insulation characteristics by use of the simple process, such that the open face rate of the electrodes may not become markedly low.

The third base plate with electrodes in accordance with the present invention is produced with the process, wherein the electrical insulating sections are formed at the electrode gaps among the plurality of the electrodes by use of the material different from the electrode material, such that the electrical insulating sections cover the side face regions of the electrodes. The electrical insulating sections are formed in the state, in which the resist pattern having been formed as the electrode patterning mask remains on the top surfaces of the plurality of the electrodes. With the third base plate with electrodes in accordance with the present invention, the resist pattern having been formed as the electrode patterning mask is utilized directly as the mask for the formation of the electrical insulating sections. Therefore, with the third base plate with electrodes in accordance with the present invention, the side face regions of the electrodes are capable of being reliably imparted with the electrical insulation characteristics by use of the simple process, such that the open face rate of the electrodes may not become markedly low.

Each of the electro-optical device and the electroluminescent device in accordance with the present invention comprises the first, second, or third base plate with electrodes in accordance with the present invention. Therefore, with each of the electro-optical device and the electroluminescent device in accordance with the present invention, the occurrence of the leak current flowing through the side face regions of the electrodes is capable of being suppressed. Accordingly, the displaying quality, the reliability, and the like, are capable of being kept high.

DESCRIPTION OF THE PREFERRED EMBODIMENTS

The present invention will hereinbelow be described in further detail with reference to the accompanying drawings.

First Embodiment of the Base Plate with Electrodes

Figure 1:
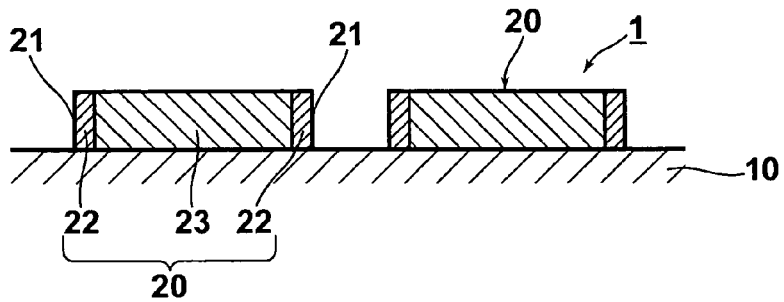
FIG. 1 is a sectional view showing a first embodiment of the base plate with electrodes in accordance with the present invention.

A first embodiment of the base plate with electrodes in accordance with the present invention and a process for producing the first embodiment of the base plate with electrodes in accordance with the present invention will be described hereinbelow. FIG. 1 is a sectional view showing a first embodiment of the base plate with electrodes in accordance with the present invention, the view being taken in a thickness direction of the base plate with electrodes. FIGS. 2A to 2F are explanatory views showing a process for producing the base plate with electrodes of FIG. 1. FIG. 1 and FIGS. 2A to 2F are the sectional views with respect to an array direction of the electrodes. In FIG. 1 and FIGS. 2A to 2F, different parts are drawn on slightly different reduced scales.

With reference to FIG. 1, a base plate with electrodes 1, which is the first embodiment of the base plate with electrodes in accordance with the present invention, comprises a flat base plate 10 and a plurality of electrodes 20, 20, . . . , which have been formed in a predetermined pattern on the flat base plate 10. In this embodiment, the base plate with electrodes 1 is constituted as a base plate with electrodes for a passive matrix type of device, which base plate is provided with the plurality of the electrodes 20, 20, . . . having been formed in a stripe-like pattern. Each of the electrodes 20, 20, . . . has a structure such that side face regions 21, 21 of each of the electrodes 20, 20, . . . and the regions of each of the electrodes 20, 20, . . . , which regions neighbor with the side face regions 21, 21, constitute electrical insulating sections 22, 22, which have a composition different from the composition of the other region 23 of each of the electrodes 20, 20, . . . and have electrical insulation characteristics. In each of the electrodes 20, 20, . . . , the other region 23, which is other than the electrical insulating sections 22, 22, has the electrical conductivity and acts as the electrode.

No limitation is imposed upon the kind of the flat base plate 10. By way of example, the flat base plate 10 may be a glass base plate, a silicon base plate, a metal base plate whose surface has been subjected to insulation characteristics imparting processing, or a resin base plate. Also, the electrodes 20, 20, . . . may be made from one of various materials, such as indium tin oxide (ITO), indium zinc oxide (IZO), and Al.

A process for producing the base plate with electrodes 1 will be described hereinbelow with reference to FIGS. 2A to 2F.

Figure 2A:
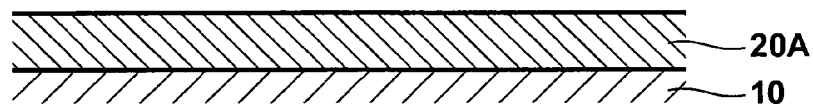
FIGS. 2A to 2F are explanatory views showing a process for producing the base plate with electrodes of FIG. 1.
Figure 2B:
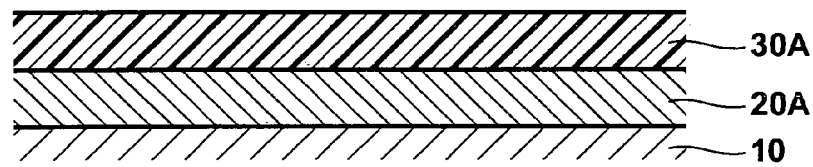
Figure 2C:
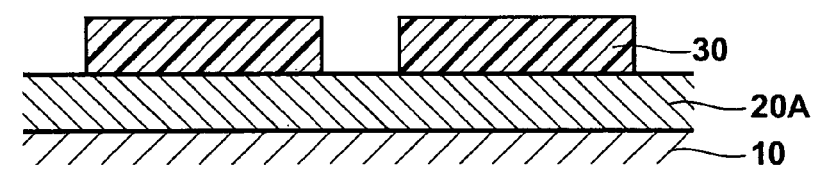
Figure 2D:
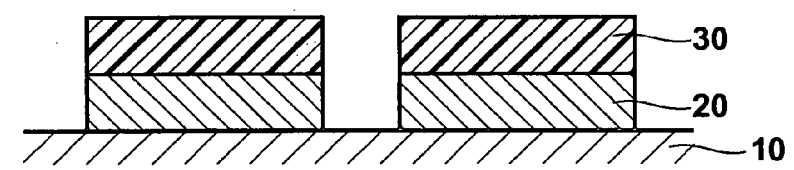

Firstly, as illustrated in FIG. 2A, in a step (A), the flat base plate 10 is prepared, and a film of an electrode material is formed with a vacuum evaporation technique, or the like, on approximately the entire area of the surface of the flat base plate 10. In this manner, an electrical conductor layer 20A is formed on the flat base plate 10. Thereafter, as illustrated in FIG. 2B and FIG. 2C, in a step (B), a positive type or negative type of a photoresist layer 30A is formed with a spin coating technique, or the like, on approximately the entire area of the surface of the electrical conductor layer 20A having been formed on the flat base plate 10, and exposure (preferably, step exposure) and development are performed on the photoresist layer 30A. In this manner, a resist pattern 30 in accordance with the pattern of the electrodes 20, 20, . . . is formed on the electrical conductor layer 20A. Thereafter, as illustrated in FIG. 2D, in a step (C), etching processing is performed on the electrical conductor layer 20A by the utilization of the resist pattern 30 as a mask, and the plurality of the electrodes 20, 20, . . . are formed in the predetermined pattern.

Figure 2E:
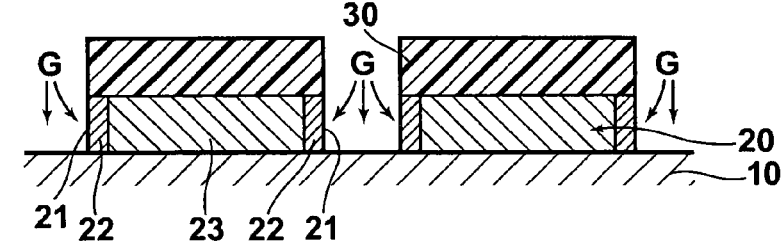

Thereafter, as illustrated in FIG. 2E, in a step (D), an insulation characteristics imparting processing gas G is brought into contact with the plurality of the electrodes 20, 20, . . . in the state, in which the resist pattern 30 remains on the top surfaces of the electrodes 20, 20, . . . . At this time, since the top surfaces of the electrodes 20, 20, . . . have been covered with the resist pattern 30, the insulation characteristics imparting processing gas G comes into contact with only the side face regions 21, 21 of each of the electrodes 20, 20, . . . .

The insulation characteristics imparting processing gas G may be selected from various gases, which are capable of imparting the electrical insulation characteristics to the electrodes 20, 20, . . . . For example, the insulation characteristics imparting processing gas G may be one of active gases having activity with respect to the electrodes 20, 20, . . . , such as an oxygen gas, a nitrogen gas, and a sulfur gas, or a mixture of at least two of the active gases enumerated above. Alternatively, the insulation characteristics imparting processing gas G may be a mixture of an active gas and an inert gas, which mixture is capable of imparting the electrical insulation characteristics to the electrodes 20, 20, . . . .

In cases where the insulation characteristics imparting processing gas G exemplified above is brought into contact with the side face regions 21, 21 of each of the electrodes 20, 20, . . . , the non-metallic atoms, such as O, N, or S, are injected into the side face regions 21, 21 of each of the electrodes 20, 20, . . . and the regions neighboring with the side face regions 21, 21. As a result, the composition of the side face regions 21, 21 of each of the electrodes 20, 20, . . . and the regions neighboring with the side face regions 21, 21 is altered. The side face regions 21, 21 of each of the electrodes 20, 20, . . . and the regions neighboring with the side face regions 21, 21 are thus imparted with the electrical insulation characteristics and constitute the electrical insulating sections 22, 22. In cases where the electrodes 20, 20, . . . are made from the oxide material, such as ITO or IZO, the insulation characteristics imparting effect is capable of being obtained in the same manner as that described above. In FIG. 2E, the interface between each of the electrical insulating sections 22, 22, and the other region 23 (i.e., the region, which has been prevented by the resist pattern 30 from being brought into contact with the insulation characteristics imparting processing gas G) is illustrated clearly. However, the interface may not be clear.

Figure 2F:
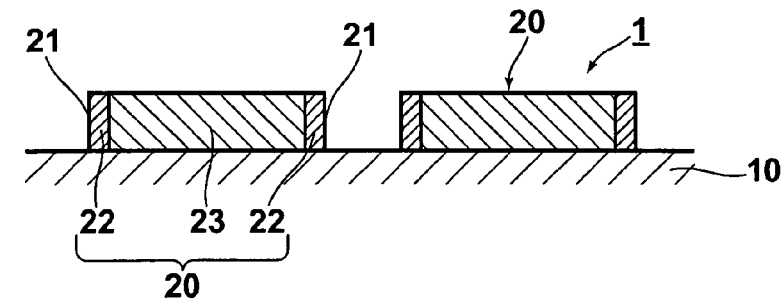

Finally, as illustrated in FIG. 2F, in a step (E), the resist pattern 30 is removed from the electrodes 20, 20, . . . . At this stage, this embodiment of the base plate with electrodes 1 is obtained.

In this embodiment of the base plate with electrodes 1, the side face regions 21, 21 of each of the electrodes 20, 20, . . . and the regions neighboring with the side face regions 21, 21 have the composition different from the composition of the other region 23 and constitute the electrical insulating sections 22, 22 having the electrical insulation characteristics. This embodiment of the base plate with electrodes 1 is produced with the process, wherein the insulation characteristics imparting processing gas G is brought into contact with the electrodes 20, 20, . . . in the state, in which the resist pattern 30 having been formed as the patterning mask for the formation of the electrodes 20, 20, . . . remains on the top surfaces of the electrodes 20, 20, . . . .

In this embodiment, the resist pattern 30 having been formed as the patterning mask for the formation of the electrodes 20, 20, . . . is utilized directly as the mask for the insulation characteristics imparting processing. Therefore, the side face regions 21, 21 of each of the electrodes 20, 20, . . . and the regions neighboring with the side face regions 21, 21 are capable of being reliably imparted with the electrical insulation characteristics by use of the simple process. Also, the insulation characteristics imparting processing gas G comes into contact with only the side face regions 21, 21 of each of the electrodes 20, 20, . . . . Therefore, for example, with respect to an electrode width falling within the range of 50 µm to 200 µm, the section imparted with the electrical insulation characteristics falls within the range of at most approximately 1 µm from each of the side face regions 21, 21. Accordingly, the open face rate of the electrodes 20, 20, . . . is capable of being kept high. It is also possible to impart the electrical insulation characteristics to only the side face regions 21, 21.

As described above, with the first embodiment of the base plate with electrodes 1 in accordance with the present invention, the side face regions 21, 21 of each of the electrodes 20, 20, . . . are capable of being reliably imparted with the electrical insulation characteristics by use of a simple process, such that the open face rate of the electrodes 20, 20, . . . may not become markedly low.

In cases where an electro-optical device, such as an electroluminescent (EL) device or a liquid crystal device, is constituted by use of the first embodiment of the base plate with electrodes 1 in accordance with the present invention, an electro-optical device, in which the occurrence of the leak current flowing through the side face regions 21, 21 of each of the electrodes 20, 20, . . . is capable of being suppressed, and which has good displaying quality, high reliability, and the like, is capable of being furnished reliably.

Second Embodiment of the Base Plate with Electrodes

Figure 3:
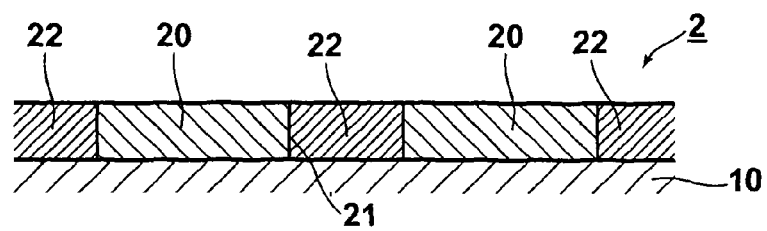
FIG. 3 is a sectional view showing a second embodiment of the base plate with electrodes in accordance with the present invention.

A second embodiment of the base plate with electrodes in accordance with the present invention and a process for producing the second embodiment of the base plate with electrodes in accordance with the present invention will be described hereinbelow. FIG. 3 is a sectional view showing a second embodiment of the base plate with electrodes in accordance with the present invention. FIGS. 4A to 4E are explanatory views showing a process for producing the base plate with electrodes of FIG. 3. In FIG. 3 and FIGS. 4A to 4E, similar elements are numbered with the same reference numerals with respect to FIG. 1 and FIGS. 2A to 2F. In the second embodiment, as in the first embodiment described above, the base plate with electrodes is constituted as a base "plate" with electrodes for a passive matrix type of device, which base plate is provided with the plurality of the electrodes having been formed in a stripe-like pattern.

With reference to FIG. 3, as in the first embodiment described above, a base plate with electrodes 2, which is the second embodiment of the base plate with electrodes in accordance with the present invention, comprises the flat base plate 10 and a plurality of electrodes 20', 20', . . . , which have been formed in a predetermined patter non the flat base plate 10. In the second embodiment, electrical insulating sections 22', 22', . . . are formed at electrode gaps among the plurality of the electrodes 20', 20', . . . . Also, the electrodes 20', 20', . . . and the electrical insulating sections 22', 22', . . . are formed from an identical electrical conductor layer.

A process for producing the base plate with electrodes 2 will be described hereinbelow with reference to FIGS. 4A to 4E.

Figure 4A:
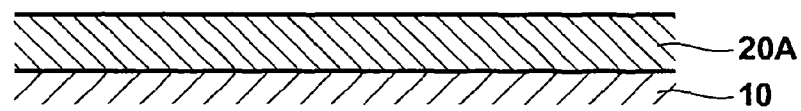
FIGS. 4A to 4E are explanatory views showing a process for producing the base plate with electrodes of FIG. 3.
Figure 4B:
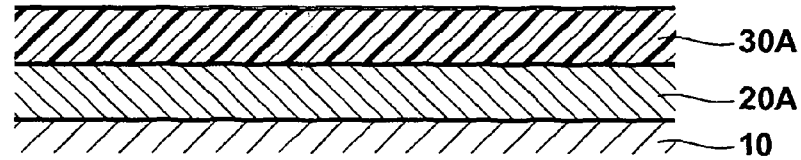
Figure 4C:
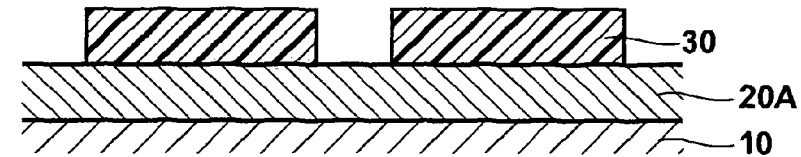

Firstly, as illustrated in FIG. 4A, in the step (A), the electrical conductor layer 20A is formed on the flat base plate 10 as in the first embodiment described above. Thereafter, as illustrated in FIG. 4B and FIG. 4C, in the step (B), the resist pattern 30 in accordance with the pattern of the electrodes 20', 20', . . . is formed on the electrical conductor layer 20A as in the first embodiment described above.

Figure 4D:
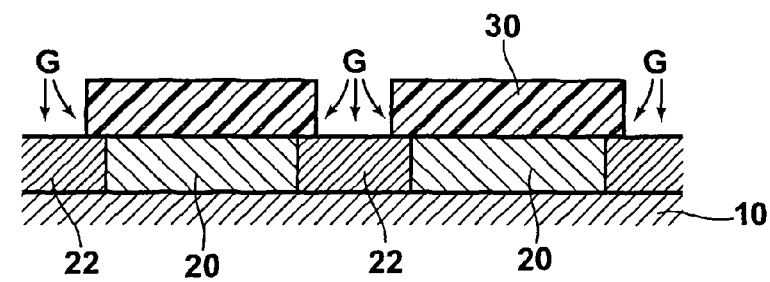

Thereafter, as illustrated in FIG. 4D, in a step (F), the insulation characteristics imparting processing gas G is brought into contact with the electrical conductor layer 20A by the utilization of the resist pattern 30 as a mask. The insulation characteristics imparting processing gas G may be selected from the gases exemplified above for the first embodiment.

In the step (F), the insulation characteristics imparting processing gas G comes into contact with only the regions of the electrical conductor layer 20A, which regions are not covered with the resist pattern 30, and the non-metallic atoms, such as O, N, or S, are injected into the regions of the electrical conductor layer 20A, which regions are not covered with the resist pattern 30. The composition of the regions of the electrical conductor layer 20A, which regions are not covered with the resist pattern 30, or the regions, which contain the aforesaid regions and the regions neighboring with the aforesaid regions, is thus altered. The regions of the electrical conductor layer 20A, which regions are not covered with the resist pattern 30, or the regions, which contain the aforesaid regions and the regions neighboring with the aforesaid regions, are thereby imparted with the electrical insulation characteristics and constitute the electrical insulating sections 22', 22', . . . . The regions of the electrical conductor layer 20A, which regions have been prevented by the resist pattern 30 from being brought into contact with the insulation characteristics imparting processing gas G, act as the electrodes 20', 20', . . . . In this manner, the plurality of the electrodes 20', 20', . . . , which are electrically isolated by the electrical insulating sections 22', 22', . . . from one another, are formed in the predetermined pattern. In FIG. 4D, the interface between each of the electrical insulating sections 22', 22', . . . and the adjacent electrode 20' is illustrated clearly. However, the interface may not be clear.

Figure 4E:
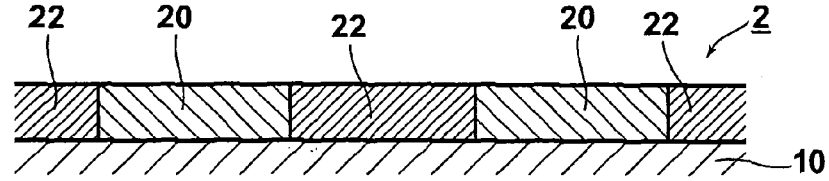

Finally, as illustrated in FIG. 4E, in the step (E), the resist pattern 30 is removed from the electrodes 20', 20', . . . . At this stage, this embodiment of the base plate with electrodes 2 is obtained.

This embodiment of the base plate with electrodes 2 is produced with the process comprising the steps of: (a) forming the film of the electrode material on the flat base plate 10, the electrical conductor layer 20A being thereby formed, (b) forming the resist pattern 30 on the electrical conductor layer 20A as the patterning mask for the formation of the electrodes 20', 20', . . . , and (c) (instead of the patterning of the electrodes 20', 20', . . . with the ordinary etching being performed) bringing the insulation characteristics imparting processing gas G into contact with the electrical conductor layer 20A by the utilization of the resist pattern 30 as the mask, the insulation characteristics imparting processing gas G causing the composition of the corresponding regions of the electrical conductor layer 20A to alter, the electrical insulating sections 22', 22', . . . being thereby formed through the alteration of the composition of the corresponding regions of the electrical conductor layer 20A.

With this embodiment of the base plate with electrodes 2 in accordance with the present invention, the regions of the electrical conductor layer 20A, which regions have been prevented by the resist pattern 30 from being brought into contact with the insulation characteristics imparting processing gas G, act as the electrodes 20', 20', . . . , and the plurality of the electrodes 20', 20', . . . , which have been electrically isolated by the electrical insulating sections 22', 22', . . . from one another, are formed in the predetermined pattern. With this embodiment of the base plate with electrodes 2 in accordance with the present invention, the composition of the regions of the electrical conductor layer 20A for the electrode formation is altered, and the electrical insulating sections 22', 22', . . . are thereby formed. Therefore, the electrical insulating sections 22', 22', . . . are capable of being easily formed at the electrode gaps. Also, since the patterning of the electrodes 20', 20', . . . with the etching need not be performed, the base plate with electrodes 2 is capable of being produced with the simple process. Further, there is no risk that the open face rate of the electrodes 20', 20', . . . will become low. Accordingly, with this embodiment of the base plate with electrodes 2 in accordance with the present invention, side face regions 21', 21' of each of the electrodes 20', 20', . . . are capable of being reliably imparted with the electrical insulation characteristics by use of the simple process, such that the open face rate of the electrodes 20', 20', . . . may not become low.

In cases where an electro-optical device, such as an EL device or a liquid crystal device, is constituted by use of the second embodiment of the base plate with electrodes 2 in accordance with the present invention, an electro-optical device, in which the occurrence of the leak current flowing through the side face regions 21', 21' of each of the electrodes 20', 20', . . . is capable of being suppressed, and which has good displaying quality, high reliability, and the like, is capable of being furnished reliably.

Third Embodiment of the Base Plate with Electrodes

Figure 5A:
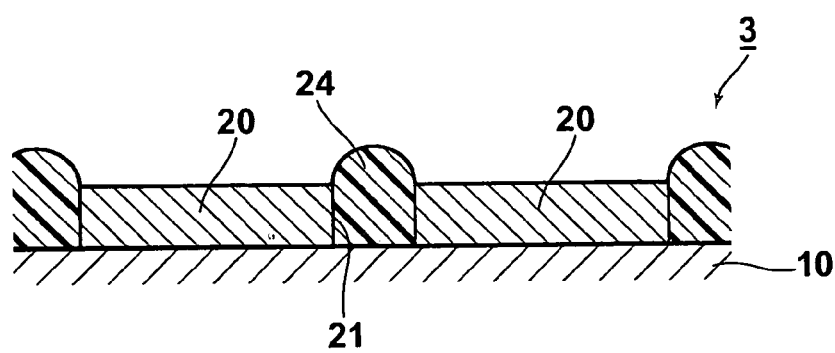
FIG. 5A is a sectional view showing a third embodiment of the base plate with electrodes in accordance with the present invention.

A third embodiment of the base plate with electrodes in accordance with the present invention and a process for producing the third embodiment of the base plate with electrodes in accordance with the present invention will be described hereinbelow. FIG. 5A is a sectional view showing a third embodiment of the base plate with electrodes in accordance with the present invention. FIGS. 6A to 6F are explanatory views showing a process for producing the base plate with electrodes of FIG. 5A. In FIG. 5A and FIGS. 6A to 6F, similar elements are numbered with the same reference numerals with respect to FIG. 3 and FIGS. 4A to 4E. In the third embodiment, as in the first and second embodiments described above, the base plate with electrodes is constituted as a base plate with electrodes for a passive matrix type of device, which base plate is provided with the plurality of the electrodes having been formed in a stripe-like pattern.

With reference to FIG. 5A, as in the second embodiment described above, a base plate with electrodes 3, which is the third embodiment of the base plate with electrodes in accordance with the present invention, comprises the flat base plate 10 and the plurality of the electrodes 20', 20', . . . , which have been formed in a predetermined pattern on the flat base plate 10. In the third embodiment, electrical insulating sections 24, 24, . . . are formed at the electrode gaps among the plurality of the electrodes 20', 20', . . . . The electrical insulating sections 24, 24, . . . are formed from a material different from the electrode material.

The width, with which each of the electrical insulating sections 24, 24, . . . is formed, is identical with the width of each of the electrode gaps. Each of the electrical insulating sections 24, 24, . . . is formed closely at the electrode gap, such that each of the electrical insulating sections 24, 24, . . . does not overlap the adjacent electrodes 20', 20'. Each of the electrical insulating sections 24, 24, . . . has a thickness distribution, such that the parts of the electrical insulating section 24, which parts neighbor with the adjacent electrodes 20', 20', are thin, and such that the middle part of the electrical insulating section 24 is thick. The minimum thickness of the electrical insulating section 24 (i.e., the thickness of each of the parts of the electrical insulating section 24, which parts stand facing the side face regions 21', 21' of the adjacent electrodes 20', 20') is approximately identical with the thickness of each of the adjacent electrodes 20', 20'. Each of the electrical insulating sections 24, 24, . . . is formed so as to cover the entire area of each of the side face regions 21', 21' of the adjacent electrodes 20', 20'. No limitation is imposed upon the composition of the electrical insulating sections 24, 24, . . . . However, the electrical insulating sections 24, 24, . . . should preferably contain an electrical insulating resin, or the like.

A process for producing the base plate with electrodes 3 will be described hereinbelow with reference to FIGS. 6A to 6F.

Figure 6A:
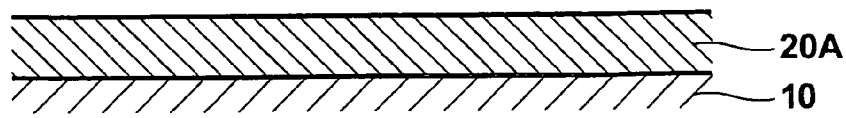
FIGS. 6A to 6F are explanatory views showing a process for producing the base plate with electrodes of FIG. 5A.
Figure 6B:
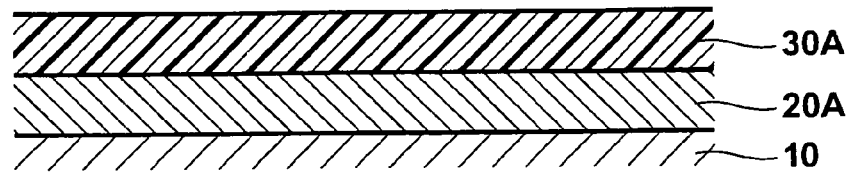
Figure 6C:
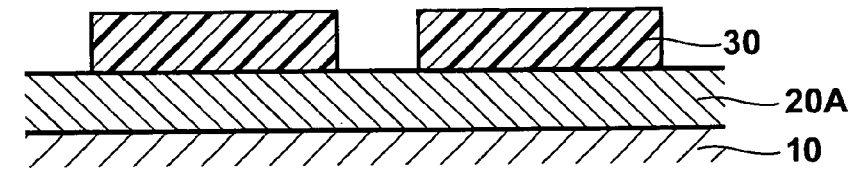
Figure 6D:
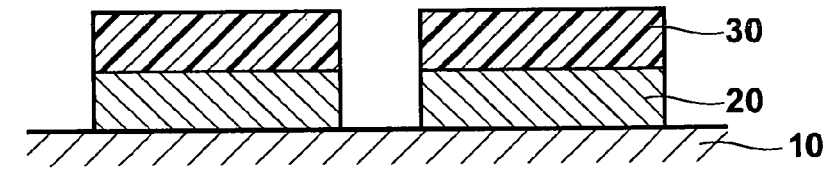

Firstly, as illustrated in FIG. 6A, in the step (A), the electrical conductor layer 20A is formed on the flat base plate 10 as in the first embodiment described above. Thereafter, as illustrated in FIG. 6B and FIG. 6C, in the step (B), the resist pattern 30 in accordance with the pattern of the electrodes 20', 20', . . . is formed on the electrical conductor layer 20A as in the first embodiment described above. Thereafter, as illustrated in FIG. 6D, in the step (C), etching processing is performed on the electrical conductor layer 20A by the utilization of the resist pattern 30 as a mask, and the plurality of the electrodes 20', 20', . . . are formed in the predetermined pattern.

In accordance with an etching rate in the etching processing, it will often occur that the width of each of the electrodes 20', 20', . . . obtained in the step (C) becomes smaller than the pattern width of the resist pattern 30. In the third embodiment, the etching rate in the etching processing is controlled, and the etching processing is performed such that the resist pattern 30 and the pattern of the electrodes 20', 20', . . . obtained in the step (C) may become approximately identical with each other. Alternatively, in cases where the resist pattern 30 having a pattern width larger than the pattern width of the electrodes 20', 20', . . . is formed, in a step (H) (not shown), processing for narrowing the pattern width of the resist pattern 30 may be performed such that the resist pattern 30 may become approximately identical with the pattern of the electrodes 20', 20', . . . , and then the next step may be performed.

Figure 6E:
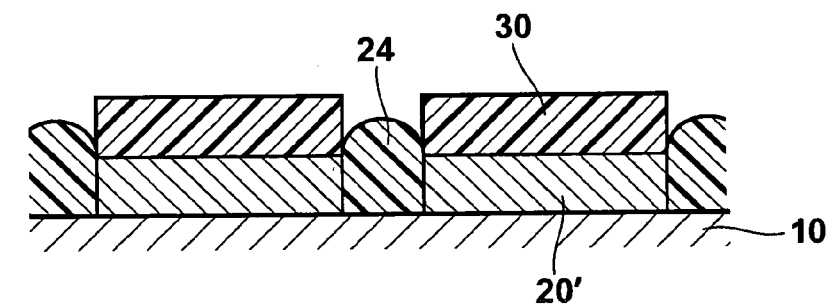

Thereafter, as illustrated in FIG. 6E, in a step G, the electrical insulating sections 24, 24, . . . are formed at the electrode gaps among the plurality of the electrodes 20', 20', . . . by use of a material different from the electrode material. In the step G, since the top surfaces of the electrodes 20', 20', . . . are covered with the resist pattern 30, the electrical insulating sections 24, 24, . . . are capable of being formed selectively at only the electrode gaps among the plurality of the electrodes 20', 20', . . . . The electrical insulating sections 24, 24, . . . , each of which has the width identical with the width of each of the electrode gaps and does not overlap the adjacent electrodes 20', 20', are thus capable of being formed.

By way of example, the electrical insulating sections 24, 24, . . . may be formed with processing, in which a liquid-state or paste-state electrical insulating material is applied to the electrode gaps and is then hardened (e.g., with curing or with simply solidification by drying). Examples of the materials for the electrical insulating sections 24, 24, . . . include a melt-state electrical insulating resin and/or its precursor, and a solution containing an electrical insulating resin and/or its precursor in a solvent. The material for the electrical insulating sections 24, 24, . . . should preferably be a photoresist.

With the third embodiment, the electrical insulating sections 24, 24, . . . are capable of being formed selectively at only the electrode gaps. However, the material for the electrical insulating sections 24, 24, . . . is allowed to cling to the resist pattern 30. In cases where the material for the electrical insulating sections 24, 24, . . . has clung to the resist pattern 30, the material for the electrical insulating sections 24, 24, . . . is capable of being removed together with the resist pattern 30 in the post step of removing the resist pattern 30. However, from the view point of the material cost, and the like, the electrical insulating sections 24, 24, . . . should preferably be formed selectively at only the electrode gaps among the electrodes 20', 20', . . . .

The material for the electrical insulating sections 24, 24, . . . should preferably be selected from the materials, which have hydrophilic-hydrophobic characteristics different from the hydrophilic-hydrophobic characteristics of the resist pattern 30. Particularly, in cases where the hydrophilic characteristics of the resist pattern 30 are high, a material having high hydrophobic characteristics should preferably be utilized as the material for the electrical insulating sections 24, 24, . . . . Also, in cases where the hydrophobic characteristics of the resist pattern 30 are high, a material having high hydrophilic characteristics should preferably be utilized as the material for the electrical insulating sections 24, 24, . . . .

In cases where the material for the electrical insulating sections 24, 24, . . . is selected from the materials, which have hydrophilic-hydrophobic characteristics different from the hydrophilic-hydrophobic characteristics of the resist pattern 30, the material for the electrical insulating sections 24, 24, . . . is repelled by the resist pattern 30, and therefore it becomes easy for the material for the electrical insulating sections 24, 24, . . . to be applied selectively to only the electrode gaps. Also, even if the material for the electrical insulating sections 24, 24, . . . clings to the resist pattern 30, the amount of the material clinging to the resist pattern 30 is capable of being kept small.

For example, a material, which contains a fluorine-containing compound as the electrical insulating resin and/or its precursor, is apt to have the hydrophobic characteristics higher than the hydrophobic characteristics of a material, which does not contain the fluorine-containing compound. Therefore, for example, the material for the photoresist layer 30A and the material for the electrical insulating sections 24, 24, . . . may be selected, such that one of the material for the photoresist layer 30A and the material for the electrical insulating sections 24, 24, . . . contains the fluorine-containing compound, and such that the other does not contain the fluorine-containing compound.

Examples of commercially available fluorine-containing resists include $F_2$ RESIST AZFX-1000P (which is supplied by Clariant Co. and contains an NBHFA-co-NBTBE copolymer as a principal constituent) and BOCME-F1 (which is supplied by Clariant Co. and contains a copolymer of NBHFA-co-NBTBE protected with a t-butyl oxy carbonyl methyl group (BOCME) as a principal constituent). NBHFA-co-NBTBE is an abbreviation for the poly norbornane hexafluoro alcohol-co-norbornane t-butyl ester.

In the step (G), the electrical insulating sections 24, 24, . . . should preferably be formed such that the center thickness of each of the electrical insulating sections 24, 24, . . . may be larger than the thickness of each of the electrodes 20', 20', . . . . In such cases, the entire area of each of the side face regions 21', 21', . . . of the electrodes 20', 20', . . . is capable of being reliably covered with the electrical insulating sections 24, 24, . . . .

Figure 5B:
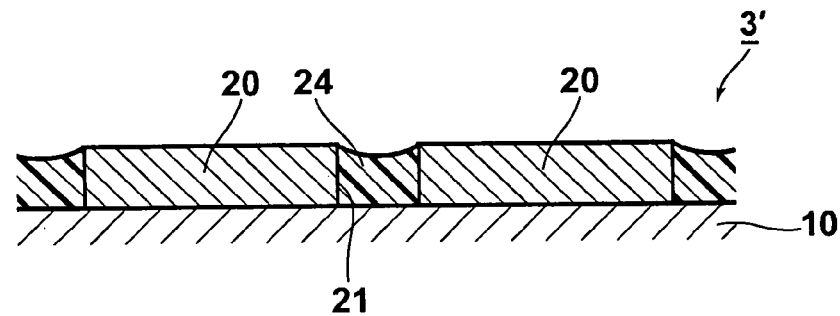
FIG. 5B is a sectional view showing a modification of the third embodiment of the base plate with electrodes in accordance with the present invention.

However, in cases where the entire area of each of the side face regions 21', 21', . . . of the electrodes 20', 20', . . . is capable of being accurately covered with the electrical insulating sections 24, 24, . . . , the center thickness of each of the electrical insulating sections 24, 24, . . . may be smaller than the thickness of each of the electrodes 20', 20', . . . . For example, as in the cases of a base plate with electrodes 3' illustrated in FIG. 5B, in cases where the center thickness of each of electrical insulating sections 24', 24', . . . is smaller than the thickness of each of the electrodes 20', 20', . . . , by the effect of the surface tension, or the like, it often occurs that the entire area of each of the side face regions 21', 21', . . . of the electrodes 20', 20', . . . is capable of being accurately covered with the electrical insulating sections 24, 24, . . . .

Figure 6F:
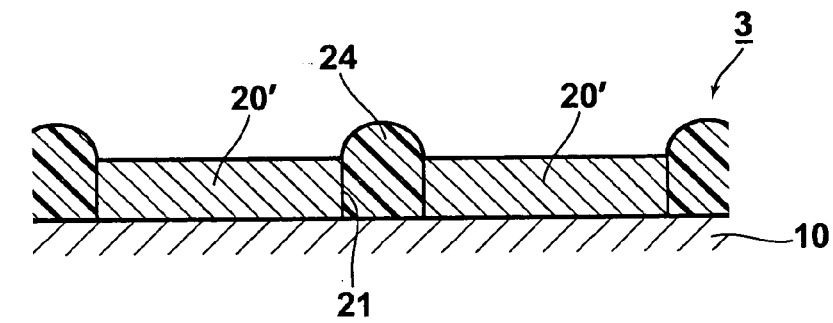

Finally, as illustrated in FIG. 6F, in the step (E), the resist pattern 30 is removed from the electrodes 20', 20', . . . . At this stage, this embodiment of the base plate with electrodes 3 is obtained.

This embodiment of the base plate with electrodes 3 is produced with the process, wherein the electrical insulating sections 24, 24, . . . , which cover the side face regions 21', 21', . . . of the electrodes 20', 20', . . . , are formed at the electrode gaps among the plurality of the electrodes 20', 20', . . . in the state, in which the resist pattern 30 having been formed as the patterning mask for the formation of the electrodes 20', 20', . . . remains on the top surfaces of the electrodes 20', 20', . . . .

In this embodiment of the base plate with electrodes 3, the resist pattern 30 having been formed as the patterning mask for the formation of the electrodes 20', 20', . . . is utilized directly as the mask for the formation of the electrical insulating sections 24, 24, . . . . Therefore, the electrical insulating sections 24, 24, . . . are capable of being formed at the electrode gaps by use of the simple process, such that no space is left between each of the side face regions 21', 21' of the adjacent electrodes 20', 20' and the corresponding one of the electrical insulating sections 24, 24, . . . . The side face regions 21', 21', . . . of the electrodes 20', 2', . . . are thus capable of being reliably imparted with the electrical insulation characteristics. Also, in cases where the material for the electrical insulating sections 24, 24, . . . clings to the resist pattern 30, the material clinging to the resist pattern 30 is capable of being removed together with the resist pattern 30. Therefore, the electrical insulating sections 24, 24, . . . do not overlap the electrodes 20', 20', . . . , and the open face rate of the electrodes 20', 20', . . . does not become low due to the presence of the electrical insulating sections 24, 24, . . . . As described above, with the third embodiment of the base plate with electrodes 3 in accordance with the present invention, the side face regions 21', 21' of each of the electrodes 20', 20', . . . are capable of being reliably imparted with the electrical insulation characteristics by use of the simple process, such that the open face rate of the electrodes 20', 20', . . . may not become low.

In cases where an electro-optical device, such as an EL device or a liquid crystal device, is constituted by use of the third embodiment of the base plate with electrodes 3 in accordance with the present invention, an electro-optical device, in which the occurrence of the leak current flowing through the side face regions 21', 21' of each of the electrodes 20', 20', . . . is capable of being suppressed, and which has good displaying quality, high reliability, and the like, is capable of being furnished reliably.

Embodiment of the EL Device

Figure 7A:
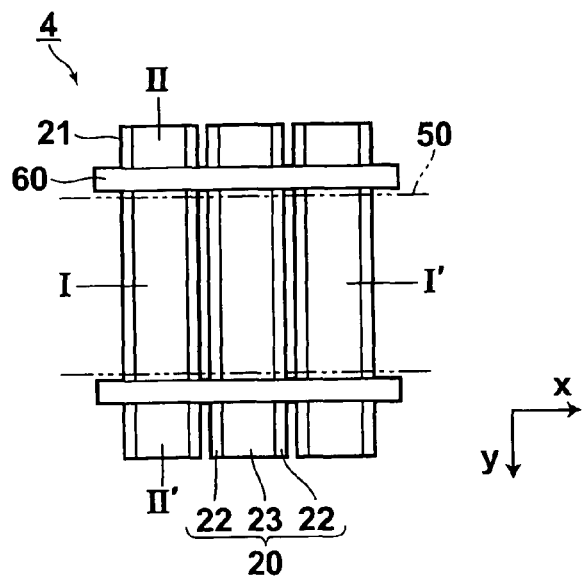
FIG. 7A is a plan view showing one pixel of an embodiment of the electro-optical device in accordance with the present invention, which is constituted as an organic EL device.
Figure 7B:
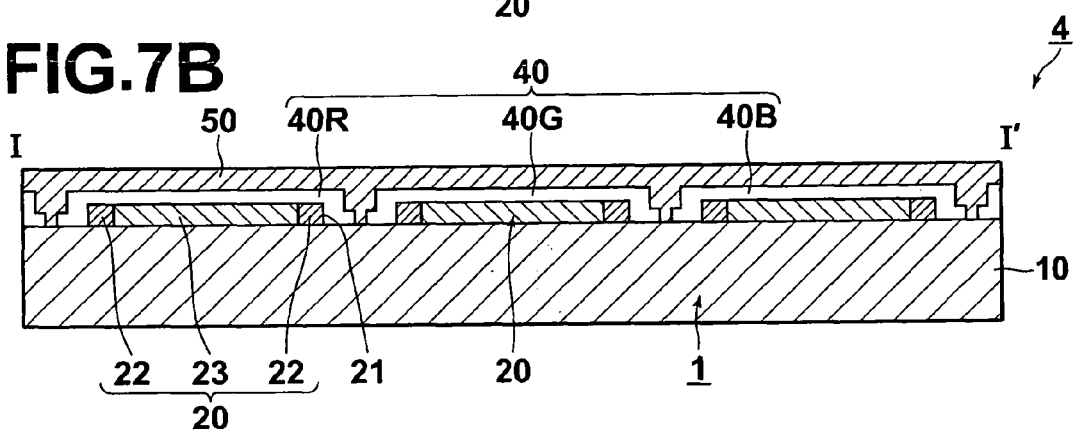
FIG. 7B is a sectional view taken on line I-I of FIG. 7A.
Figure 7C:
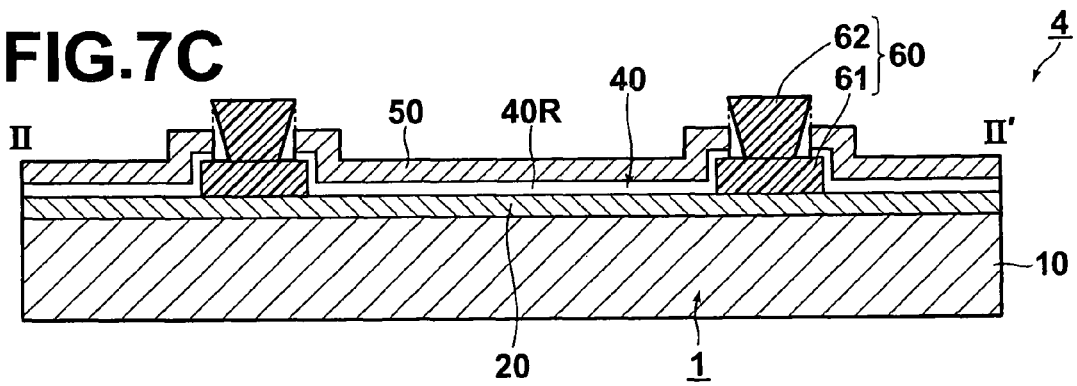
FIG. 7C is a sectional view taken on line II-II of FIG. 7A.
Figure 8:
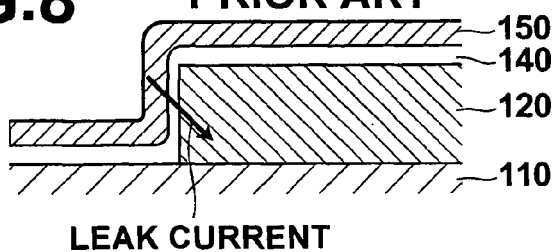
FIG. 8 is a fragmentary sectional view taken in a thickness direction of a conventional EL device, the view acting as an aid in explaining problems encountered with the conventional EL device.

An embodiment of the electro-optical device in accordance with the present invention, which is constituted as an organic EL device, will be described hereinbelow with reference to FIGS. 7A, 7B, and 7C. FIG. 7A is a plan view showing one pixel of an embodiment of the electro-optical device in accordance with the present invention, which is constituted as an organic EL device, a base plate being omitted for clearness. FIG. 7B is a sectional view taken on line I-I of FIG. 7A. FIG. 7C is a sectional view taken on line II-II of FIG. 7A. In FIG. 7A, the position of an upper electrode 50 and the position of each of partition walls 60, 60 are slightly shifted from each other for clearness.

As illustrated in FIGS. 7A, 7B, and 7C, an organic EL device 4, which is an embodiment of the electro-optical device in accordance with the present invention, is a passive matrix type of an organic EL device constituted by use of the first embodiment of the base plate with electrodes 1 in accordance with the present invention. At least a light emitting layer 40 and a plurality of upper electrodes (i.e., the opposite electrodes) 50, 50, . . . are overlaid on the base plate with electrodes 1 of the organic EL device 4. An electric field is applied between each of the plurality of the electrodes 20, 20, . . . of the base plate with electrodes 1 and the corresponding one of the plurality of the upper electrodes 50, 50, . . . . The base plate with electrodes 1, the light emitting layer 40 and the upper electrodes 50, 50, . . . are hermetically sealed. (The sealing structure is not shown.)

In the cases of the organic EL device 4, each of the lower electrodes 20, 20, . . . acts as an anode, and each of the upper electrodes 50, 50, . . . acts as a cathode. The light emitting material contained in the light emitting layer 40 is excited to emit light by energy obtained from recombination of positive holes, which are injected from the anode, and electrons, which are injected from the cathode. Displaying, or the like, is thus performed by the organic EL device 4. When necessary, an organic layer, such as a positive hole injecting layer and/or a positive hole transporting layer, is formed between the lower electrodes 20, 20, . . . and the light emitting layer 40. Also, when necessary, an organic layer, such as an electron injecting layer and/or an electron transporting layer, is formed between the light emitting layer 40 and the upper electrode 50, 50, . . . . The relationship between the position of the anode and the position of the cathode may be reversed.

The lower electrodes 20, 20, . . . are formed in a striped pattern. Also, the upper electrodes 50, 50, . . . are formed in a striped pattern. Each of the lower electrodes 20, 20, . . . and each of the upper electrodes 50, 50, . . . extend in directions, which are normal to each other.

In this embodiment of the organic EL device 4, each of the pixels in the light emitting layer 40 comprises a light emitting layer 40R for emitting red light (R), a light emitting layer 40G for emitting green light (G), and a light emitting layer 40B for emitting blue light (B). The light emitting layers 40R, 40R, . . . , the light emitting layers 40G, 40G, . . . , and the light emitting layers 40B, 40B, . . . are formed in a predetermined pattern in accordance with displaying dots. One pixel is constituted of the three displaying dots for emitting the red light, the green light, and the blue light, respectively.

This embodiment of the organic EL device 4 is constituted by use of the base plate with electrodes 1. As illustrated in FIGS. 7A and 7B, the side face regions 21, 21 of each of the lower electrodes 20, 20, . . . and the regions neighboring with the side face regions 21, 21 have the composition different from the composition of the other region 23 and constitute the electrical insulating sections 22, 22 having the electrical insulation characteristics. Therefore, with respect to the array direction of the lower electrodes 20, 20, . . . in which the lower electrodes 20, 20, . . . are arrayed so as to stand side by side (i.e., with respect to the direction indicated by the arrow x in FIG. 7A), the occurrence of the leak current flowing through each of the side face regions 21, 21 of each of the lower electrodes 20, 20, . . . is restricted by the presence of each of the electrical insulating sections 22, 22.

As illustrated in FIGS. 7A and 7C, partition walls 60, 60, . . . having the electrical insulation characteristics are formed on the flat base plate 10. The partition walls 60, 60, . . . partitions off the displaying dots with respect to the direction along which each of the lower electrodes 20, 20, . . . extends (i.e., with respect to the direction indicated by the arrow y in FIG. 7A). Each of the partition walls 60, 60, . . . comprises a flat section 61 and an inverse tapered section 62, which is formed on the flat section 61. The width of a bottom surface of the inverse tapered section 62 is set to be smaller than the width of the flat section 61. The partition walls 60, 60, . . . are capable of being formed with a known photo-lithographic process.

After the lower electrodes 20, 20, . . . have been formed in the predetermined pattern, the partition walls 60, 60, . . . are formed, and then the organic layer containing the light emitting layer 40 is formed with a vacuum evaporation technique, or the like. With the constitution described above, each of the ends of each of the light emitting layer 40R, the light emitting layer 40G, and the light emitting layer 40B, which ends are taken with respect to the direction indicated by the arrow y in FIG. 7A, is formed on the flat section 61 of each of the partition walls 60, 60, . . . . Therefore, each of the lower electrodes 20, 20, . . . and each of the upper electrodes 50, 50, . . . are capable of being reliably isolated electrically from each other via the flat section 61 of each of the partition walls 60, 60, . . . . Also, since each of the partition walls 60, 60, . . . has the inverse tapered section 62, the width of the upper electrode 50, which width is taken with respect to the direction indicated by the arrow y in FIG. 7A, does not become larger than the widths of the light emitting layer 40R, the light emitting layer 40G, and the light emitting layer 40B. Therefore, the occurrence of the unnecessary leak current is capable of being suppressed.

This embodiment of the organic EL device 4 is constituted by use of the base plate with electrodes 1. Therefore, the organic EL device 4 is capable of being produced with the simple process. Also, the open face rate of the lower electrodes 20, 20, . . . is capable of being kept high, and the side face regions 21, 21 of each of the lower electrodes 20, 20, . . . are capable of being reliably imparted with the electrical insulation characteristics. As a result, the occurrence of the leak current flowing through the side face regions 21, 21 of each of the lower electrodes 20, 20, . . . is capable of being suppressed.

With this embodiment of the organic EL device 4, wherein the occurrence of the leak current flowing through the side face regions 21, 21 of each of the lower electrodes 20, 20, . . . is capable of being suppressed, the lowering of the light emission quantity due to the leak current, nonuniformity in light emission pattern due to nonuniformity in light emission quantity with respect to the pixels, and the like, are capable of being suppressed. Also, since the open face rate of the lower electrodes 20, 20, . . . is kept high, the lower electrodes 20, 20, . . . are capable of being formed at high definition pitches, and a high resolution is capable of being obtained. The organic EL device 4 is capable of exhibiting good characteristics with respect to the light emission quantity (the luminance), uniform light emission pattern, and a high resolution. Therefore, the organic EL device 4 has good displaying quality, and the like.

Further, since the occurrence of the leak current flowing through the side face regions 21, 21 of each of the lower electrodes 20, 20, . . . is suppressed, deterioration of the light emitting layer 40 on the sides of the side face regions 21, 21 of each of the lower electrodes 20, 20, . . . is capable of being suppressed. Therefore, the occurrence of the short-circuiting between each of the lower electrodes 20, 20, . . . and each of the upper electrodes 50, 50, . . . due to thinning of the thickness of the light emitting layer 40 on the sides of the side face regions 21, 21 of each of the lower electrodes 20, 20, . . . is capable of being suppressed. Accordingly, the organic EL device 4 has a high long-term use stability and a high reliability.

The open face rate of the lower electrodes 20, 20, . . . and the resolution of the organic EL device 4 will hereinbelow be described in more detail by comparison with the conventional technique.

As described above, in cases where the black matrix (BM) having the electrical insulation characteristics is formed at the electrode gaps among the lower electrodes by use of the technique illustrated in, for example, FIG. 3 of Japanese Unexamined Patent Publication No. 2002-359083, there is the risk that a fine gap will occur between the side face of each of the lower electrodes and the BM due to a shift of alignment of the photomask occurring at the time of the exposure of the resist for the formation of the BM to light. In order for the occurrence of the fine gap between the side face of each of the lower electrodes and the BM to be suppressed, it is necessary that part (at least approximately 10 μm part) of each of the lower electrodes and part (at least approximately 10 μm part) of the BM are caused to overlap each other.

By way of example, the pixel size may be set to be 300 μm×300 μm, the width of the electrode gap between adjacent lower electrodes may be 10 μm, and the 10 μm part of each of the lower electrodes and the 10 μm part of the BM may be caused to overlap each other. In such cases, the open face rate of the lower electrodes becomes equal to 70%. In cases where the pixel size is set to be 150 μm×500 μm with the resolution being increased by a factor of 2, and the other conditions are kept the same as those described above, the open face rate of the lower electrodes becomes as low as 40%. In order for the calculation to be simplified, the open face width, which is taken in the direction indicated by the arrow y in FIG. 7A, is herein not taken into consideration.

With the EL device illustrated in, for example, FIG. 3 of Japanese Unexamined Patent Publication No. 2002-359083, as described above, in cases where the resolution is set to be high, the open face rate of the lower electrodes becomes markedly low. Therefore, in order for an identical luminance level to be obtained, it is necessary for the light emission quantity to be increased. In such cases, the life time of the light emitting layer is not capable of being kept long, and the reliability is not capable of being kept high. In order for a sufficient open face area to be obtained, it is necessary for the resolution to be lowered. In such cases, high definition displaying is not capable of being performed.

This embodiment of the organic EL device 4 in accordance with the present invention is constituted by use of the base plate with electrodes 1. The base plate with electrodes 1 has the structure such that the side face regions 21, 21 of each of the electrodes 20, 20, . . . and the regions neighboring with the side face regions 21, 21 have the composition different from the composition of the other region 23 and constitute the electrical insulating sections 22, 22 having the electrical insulation characteristics. The base plate with electrodes 1 is produced with the process, wherein the insulation characteristics imparting processing gas G is brought into contact with the electrodes 20, 20, . . . in the state, in which the resist pattern 30 having been formed as the patterning mask for the formation of the electrodes 20, 20, . . . remains on the top surfaces of the electrodes 20, 20, . . . . The insulation characteristics imparting processing gas G comes into contact with only the side face regions 21, 21 of each of the electrodes 20, 20, . . . . Therefore, the width of each of the electrical insulating sections 22, 22 is as small as approximately 1 μm. In cases where the pixel size is set to be 150 μm×150 μm, the width of each of the electrical insulating sections 22, 22 is set to be approximately 1 μm, and the open face rate is calculated in the same manner as that described above, the open face rate becomes equal to 76%. This embodiment of the organic EL device 4 in accordance with the present invention has the advantages over the EL device illustrated in, for example, FIG. 3 of Japanese Unexamined Patent Publication No. 2002-359083, in that a high open face rate is capable of being obtained under the conditions of a high resolution. Specifically, with the organic EL device 4, light emission with a high luminance is capable of being achieved, and the high definition displaying is capable of being performed.

In cases where the organic EL device is constituted by use of the second embodiment of the base plate with electrodes 2 or the third embodiment of the base plate with electrodes 3 in accordance with the present invention in lieu of the base plate with electrodes 1, the same effects as those described above are capable of being obtained. Alternatively, a base plate with electrodes may be constituted by use of a combination of at least two of the insulation characteristics imparting processing employed for the base plate with electrodes 1, the insulation characteristics imparting processing employed for the base plate with electrodes 2, and the insulation characteristics imparting processing employed for the base plate with electrodes 3, and the organic EL device may be constituted by use of the thus obtained base plate with electrodes.

The aforesaid embodiment of the electro-optical device in accordance with the present invention is constituted as the organic EL device 4. Alternatively, the electro-optical device in accordance with the present invention may be constituted as an inorganic EL device. In the cases of the organic EL device, the light emitting layer is caused to emit the light by the application of an electric current. In the cases of the inorganic EL device, the light emitting layer is caused to emit the light by the application of a voltage.

Also, the aforesaid embodiment of the electro-optical device in accordance with the present invention is constituted as the passive matrix type of the organic EL device. Alternatively, the electro-optical device in accordance with the present invention may be constituted as an active matrix type of an EL device. In the cases of the active matrix type of the EL device, the lower electrodes 20, 20, . . . may be constituted as a plurality of pixel electrodes, which are arrayed in a matrix pattern. Also, a scanning line and a data line may be connected to each of the pixel electrodes via switching elements, such as thin-film transistors (TFT's). Further, the upper electrodes 50, 50, . . . may be constituted of one common electrode. In the cases of the active matrix type of the EL device, the partition walls 60, 60, . . . for the partitioning with respect to the direction indicated by the arrow y in FIG. 7A need not be formed. With the active matrix type of the EL device, the effect of the EL device in accordance with the present invention upon the enhancement of the open face rate, which effect is advantageous over the EL device illustrated in, for example, FIG. 3 of Japanese Unexamined Patent Publication No. 2002-359083, is capable of being obtained with respect to both the direction indicated by the arrow x in FIG. 7A and the direction indicated by the arrow y in FIG. 7A. Therefore, when the active matrix type of the EL device is compared with the passive matrix type of the EL device, the open face rate enhancing effect raised to the second power is capable of being obtained.

The electro-optical device in accordance with the present invention is not limited to the EL device. Specifically, the electro-optical device in accordance with the present invention may be constituted as a liquid crystal device having an electrode structure comprising: (i) the base plate with electrodes in accordance with the present invention, and (ii) at least one upper electrode, which is located on the base plate with electrodes with at least a liquid crystal layer intervening between the at least one upper electrode and the base plate with electrodes, such that an electric field is capable of being applied between each of the plurality of the lower electrodes of the base plate with electrodes and the at least one upper electrode. In such cases, the electro-optical device in accordance with the present invention may be constituted as a vertical electric field type of a liquid crystal device, wherein the lower electrodes are formed on one of a pair of base plates, and wherein the at least one upper electrode is formed on the other base plate. Alternatively, the electro-optical device in accordance with the present invention may be constituted as a horizontal electric field type of a liquid crystal device, wherein both the lower electrodes and the at least one upper electrode are formed on one of a pair of base plates.

INDUSTRIAL APPLICABILITY

The base plate with electrodes in accordance with the present invention and the process for producing a base plate with electrodes in accordance with the present invention are capable of being utilized appropriately for EL devices, liquid crystal devices, and the like.

What is claimed is:
1. A base plate with electrodes, comprising:
  i) a base plate, and
  ii) a plurality of electrodes, which have been formed in a predetermined pattern on the base plate,
  each of the electrodes having a structure such that interior side face regions of each of the electrodes or certain interior regions of each of the electrodes, which certain regions contain the side face regions and regions neighboring with the side face regions, have a composition different from the composition of the other interior regions of each of the electrodes and have electrical insulation characteristics; and insulating portions, which are the regions within the electrodes having electrical insulation characteristics, being formed by a metallic compound constituted by the material of the other regions of the electrode, and non metallic atoms that constitute an insulating gas.

2. A base plate with electrodes as defined in claim 1 wherein the base plate with electrodes is produced with a process comprising the steps of:
- a) forming a film of an electrode material on the base plate, an electrical conductor layer being thereby formed,
- b) forming a resist pattern on the electrical conductor layer and in accordance with the predetermined pattern of the plurality of the electrodes,
- c) performing etching processing on the electrical conductor layer by the utilization of the resist pattern as a mask, the plurality of the electrodes being thereby formed in the predetermined pattern,
- d) bringing an insulation characteristics imparting processing gas into contact with the plurality of the electrodes, thereby causing the insulation characteristics imparting processing gas to be injected into each of the plurality of electrodes through the side face regions thereof, to impart insulative properties to the side face regions within each of the electrodes or certain interior regions of each of the electrodes, which certain regions contain the side face regions and regions neighboring with the side face regions; and
- e) removing the resist pattern from the plurality of the electrodes.

3. A process for producing a base plate with electrodes provided with a base plate and a plurality of electrodes, which have been formed in a predetermined pattern on the base plate, the process comprising:
- i) a step (A) of forming a film of an electrode material on the base plate, an electrical conductor layer being thereby formed,
- ii) a step (B) of forming a resist pattern on the electrical conductor layer and in accordance with the predetermined pattern of the plurality of the electrodes,
- iii) a step (C) of performing etching processing on the electrical conductor layer by the utilization of the resist pattern as a mask, the plurality of the electrodes being thereby formed in the predetermined pattern,
- iv) a step (D) of bringing an insulation characteristics imparting processing gas into contact with the plurality of the electrodes, thereby causing the insulation characteristics imparting processing gas to be injected into each of the plurality of electrodes through the side face regions thereof, to impart insulative properties to the side face regions within each of the electrodes or certain interior regions of each of the electrodes, which certain regions contain the side face regions and regions neighboring with the side face regions, and
- v) a step (E) of removing the resist pattern from the plurality of the electrodes.

* * * * *